(12) United States Patent
Xie et al.

(10) Patent No.: US 11,525,862 B2
(45) Date of Patent: Dec. 13, 2022

(54) METHODS, STORAGE MEDIA, AND ELECTRONIC DEVICES FOR CALCULATING SHORT-CIRCUIT CURRENT OF BATTERY

(71) Applicant: DONGGUAN NVT TECHNOLOGY CO., LTD., Dongguan (CN)

(72) Inventors: Hong Xie, Dongguan (CN); Xuefeng Liu, Dongguan (CN); Guanghui Chen, Dongguan (CN)

(73) Assignee: NINGDE AMPEREX TECHNOLOGY LIMITED, Fujian (CN)

( * ) Notice: Subject to any disclaimer, the term of this patent is extended or adjusted under 35 U.S.C. 154(b) by 303 days.

(21) Appl. No.: 16/843,627

(22) Filed: Apr. 8, 2020

(65) Prior Publication Data
US 2020/0319253 A1   Oct. 8, 2020

(30) Foreign Application Priority Data

Apr. 8, 2019   (CN) .......................... 201910277037.1
Apr. 8, 2019   (CN) .......................... 201910277041.8

(51) Int. Cl.
*G01R 31/367*   (2019.01)
*G01R 31/382*   (2019.01)
(Continued)

(52) U.S. Cl.
CPC ....... *G01R 31/367* (2019.01); *G01R 31/3648* (2013.01); *G01R 31/382* (2019.01); *G01R 31/389* (2019.01); *G01R 31/52* (2020.01)

(58) Field of Classification Search
CPC .. G01R 31/367; G01R 31/382; G01R 31/389; G01R 31/52; G01R 31/3648
(Continued)

(56) References Cited

U.S. PATENT DOCUMENTS

2007/0284159 A1* 12/2007 Takami ................. B60L 58/24
                                                   429/61
2008/0120050 A1   5/2008 Iwane et al.
(Continued)

FOREIGN PATENT DOCUMENTS

CN   1821801 A   8/2006
CN   102709614 A  10/2012
(Continued)

OTHER PUBLICATIONS

Dongguan NVT Technology Co. Ltd., Extended European Search Report, EP20168636.7, dated Aug. 25, 2020, 9 pgs.
Office Action, CN201910277041.8, dated Aug. 17, 2021, 8 pgs.

*Primary Examiner* — Patrick Assouad
*Assistant Examiner* — Trung Q Nguyen
(74) *Attorney, Agent, or Firm* — Morgan, Lewis & Bockius LLP (57) ABSTRACT

A method for calculating a short-circuit current of a battery. includes: obtaining an integral state of charge and a current state of charge of the battery; calculating a first difference based on the integral state of charge and the current state of charge; calculating the short-circuit current of the battery based on the first difference; obtaining a first real state of charge and a second real state of charge; updating the first real state of charge and the second real state of charge based on a temperature-impedance table and the short-circuit current of the battery; calculating a second difference based on the updated first real state of charge and the updated second real state of charge; and updating the short-circuit current of the battery based on the second difference.

18 Claims, 5 Drawing Sheets

(51) Int. Cl.
*G01R 31/389* (2019.01)
*G01R 31/52* (2020.01)
*G01R 31/36* (2020.01)

(58) Field of Classification Search
USPC .................................... 324/425–430; 702/63
See application file for complete search history.

(56) References Cited

U.S. PATENT DOCUMENTS

| | | |
|---|---|---|
| 2011/0148426 A1 | 6/2011 | Yokotan |
| 2011/0187329 A1* | 8/2011 | Majima ................. H01M 10/48 |
| | | 320/149 |
| 2016/0259012 A1 | 9/2016 | Sejima et al. |
| 2019/0219640 A1 | 7/2019 | Liu et al. |
| 2019/0305384 A1* | 10/2019 | Liu ...................... G01R 31/396 |

FOREIGN PATENT DOCUMENTS

| | | |
|---|---|---|
| CN | 102854470 A | 1/2013 |
| CN | 205720590 U | 11/2016 |
| CN | 107870301 A | 4/2018 |
| CN | 108107364 A | 6/2018 |
| CN | 108828455 A | 11/2018 |
| JP | 2016090399 A | 5/2016 |
| WO | WO2018/059074 A1 | 4/2018 |
| WO | WO2018/196121 A1 | 11/2018 |

* cited by examiner

METHODS, STORAGE MEDIA, AND ELECTRONIC DEVICES FOR CALCULATING SHORT-CIRCUIT CURRENT OF BATTERY

CROSS-REFERENCE TO RELATED APPLICATION

This application claims priorities to and benefits of Chinese Patent Application Nos. 201910277041.8 and 201910277037.1, both filed on Apr. 8, 2019, the entire content of which is incorporated herein by reference for all purposes.

FIELD

The disclosure relates to the field of battery detection technologies, and more particularly to, a method for calculating a short-circuit current of a battery, a computer-readable storage medium, and an electronic device.

BACKGROUND

In related technologies, methods for calculating short-circuit parameters in a battery may be carried out when the battery is in a static environment and battery parameters (current, internal resistance, temperature, etc.) are relatively stable. However, during the actual usage of the battery, the current of the battery may often fluctuate with changes in the output power of the battery. It is difficult to accurately calculate a short-circuit current of the battery through these methods.

SUMMARY

According to a first aspect of the disclosure, a method for calculating a short-circuit current of a battery is provided. The method includes: obtaining an integral state of charge and a current state of charge of the battery; calculating a first difference in state of charge between the integral state of charge and the current state of charge; calculating the short-circuit current of the battery based on the first difference in state of charge; obtaining a first real state of charge and a second real state of charge; updating the first real state of charge and the second real state of charge based on a temperature-impedance table and the short-circuit current of the battery; calculating a second difference in state of charge based on the updated first real state of charge and the updated second real state of charge; and updating the short-circuit current of the battery based on the second difference in state of charge.

According to a second aspect of the disclosure, a computer-readable storage medium is provided. The computer-readable storage medium has stored therein computer programs. When the computer programs are executed by a processor, the method according to the first aspect of the disclosure is performed.

According to a third aspect of the disclosure, an electronic device is provided. The electronic device includes: a battery, a processor; and a memory for storing instructions executable by the processor; the processor is configured to perform the method according to the first aspect of the disclosure.

DETAILED DESCRIPTION

Reference will be made in detail to embodiments of the disclosure. Examples of the embodiments are illustrated with reference to the drawings, in which the same or similar elements and the elements having same or similar functions are denoted by like reference numerals throughout the descriptions. The embodiments described herein with reference to the drawings are explanatory, illustrative, and used to generally understand the disclosure. The embodiments shall not be construed to limit the disclosure.

The following describes, with reference to the drawings, a method for calculating a short-circuit current of a battery, an apparatus for calculating a short-circuit current of a battery, a computer-readable storage medium, and an electronic product, according to embodiments of the disclosure.

Figure 1:
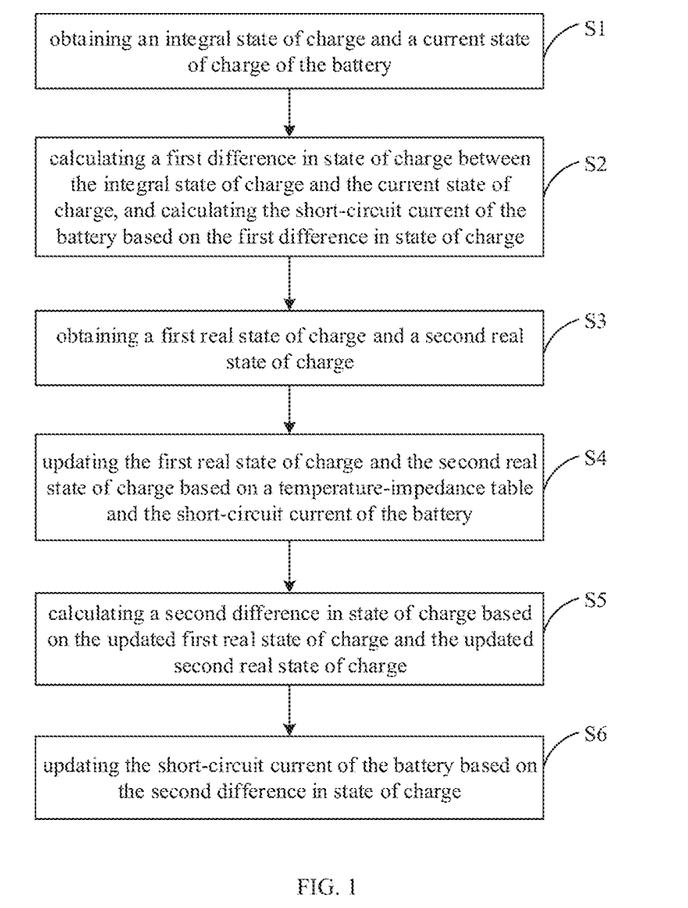
FIG. 1 is a flowchart of a method for calculating a short-circuit current of a battery according to an embodiment of the disclosure.

FIG. 1 is a flowchart of a method for calculating a short-circuit current of a battery according to an embodiment of the disclosure. As illustrated in FIG. 1, the method may include the following.

At block S1, an integral state of charge and a current state of charge of the battery are obtained.

According to an embodiment of the disclosure, obtaining the integral state of charge of the battery includes: detecting a current of the battery; and integrating the current of the battery to obtain the integral state of charge of the battery.

The current of the battery may be detected in real time by a coulomb meter. The integral state of charge of the battery may be obtained by calculating the integral of the detected current of the battery with time.

According to an embodiment of the disclosure, before obtaining the integral state of charge, it is necessary to determine whether the battery meets conditions for assigning an initial value. That is, it is determined whether the battery is in a reset/charge-off state, or whether an average current of the battery fluctuates within 50 s (that is, whether a magnitude of changes of the current is greater than 150 mA), or whether a real state of charge of the battery is updated. If the battery is in the reset/charge-off state, or the average current of the battery fluctuates within 50 s (that is, the average current of the battery within 50 s is not in a steady state), or the real state of charge of the battery is not updated (that is, the real state of charge is not within a updating range), the initial value is assigned to the battery as a reference value for obtaining the integral state of charge and the current state of charge of the battery.

The current state of charge of the battery may be a percentage of a remaining state of charge when the battery has been used for a period of time or after the battery has been left unused for a long period of time, to a total state of charge of the battery. If the state of charge of the battery is 0, it means that the remaining state of charge of the battery is 0; if the state of charge of the battery is 100, the battery is fully charged.

At block S2, a first difference in state of charge between the integral state of charge and the current state of charge is calculated.

Figure 2:
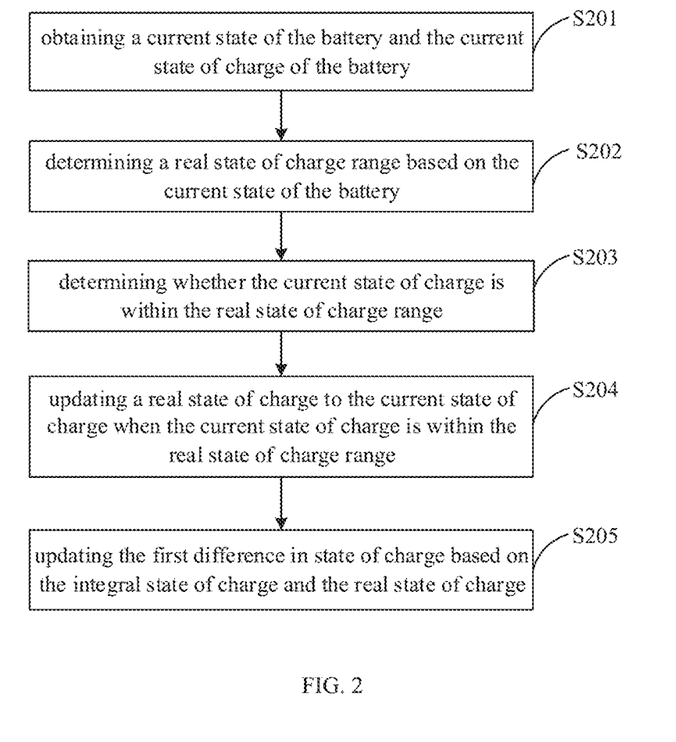
FIG. 2 is a flowchart of a method for calculating a first difference in state of charge between an integral state of charge and a current state of charge according to an embodiment of the disclosure.

As a possible implementation, as illustrated in FIG. 2, the method for calculating the first difference in state of charge between the integral state of charge and the current state of charge may include the following.

At block S201, a current state of the battery and the current state of charge of the battery are obtained.

In detail, state parameters of the battery, such as voltage and current of the battery, may be obtained, and the current state of the battery may be determined based on a change trend of the state parameters of the battery. The current state of the battery may include a discharging state, a charging state, and a stationary state. For example, when the voltage of the battery increases, the current state of the battery may be determined as the charging state; when the voltage of the battery decreases, the current state of the battery may be determined as the discharging state; when the voltage of the battery is unchanged, the current state of the battery may be determined as the stationary state.

At block S202, a real state of charge range is determined based on the current state of the battery.

According to an embodiment of the disclosure, determining the real state of charge range based on the current state of the battery may include: when the battery is currently in a discharging or charging state, determining the real state of charge range to be a first range. The first range may be a range in which an impedance change trend of the battery is consistent during discharging or charging. Preferably, the first range is [70%, 100%] or [30%, 50%].

According to another embodiment of the disclosure, determining the real state of charge range based on the current state of the battery may include: when the battery is currently in a stationary state, determining the real state of charge range to be a second range. The second range may be a range in which an impedance change trend of the battery is consistent when the battery is stationary. Preferably, the second range is [0, 100%].

In detail, due to the influence of temperature, current, and difference in batteries (difference in cells in the battery), there is a certain difference in the overall change trend of the battery's impedance. However, the local change trend of the battery's impedance is relatively consistent within a certain range (i.e., the real state of charge range).

Figure 3A:
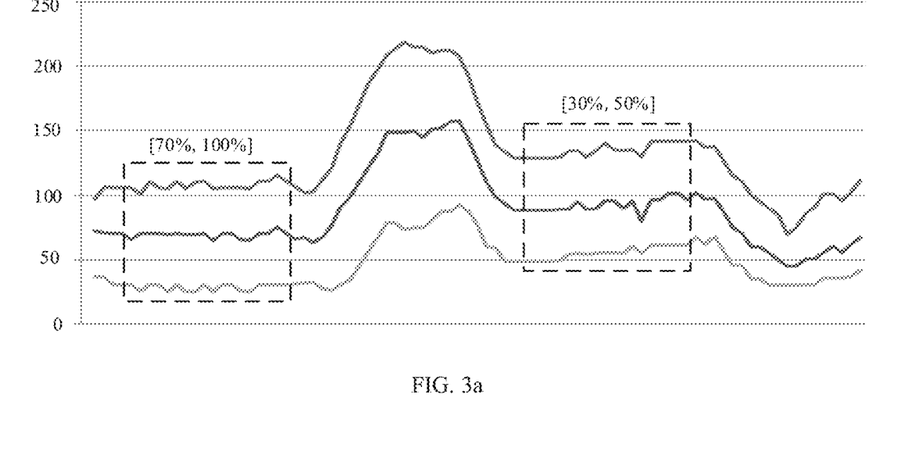
FIG. 3a is schematic diagram of a change trend of a battery's impedance under different temperature conditions according to an embodiment of the disclosure.
Figure 3B:
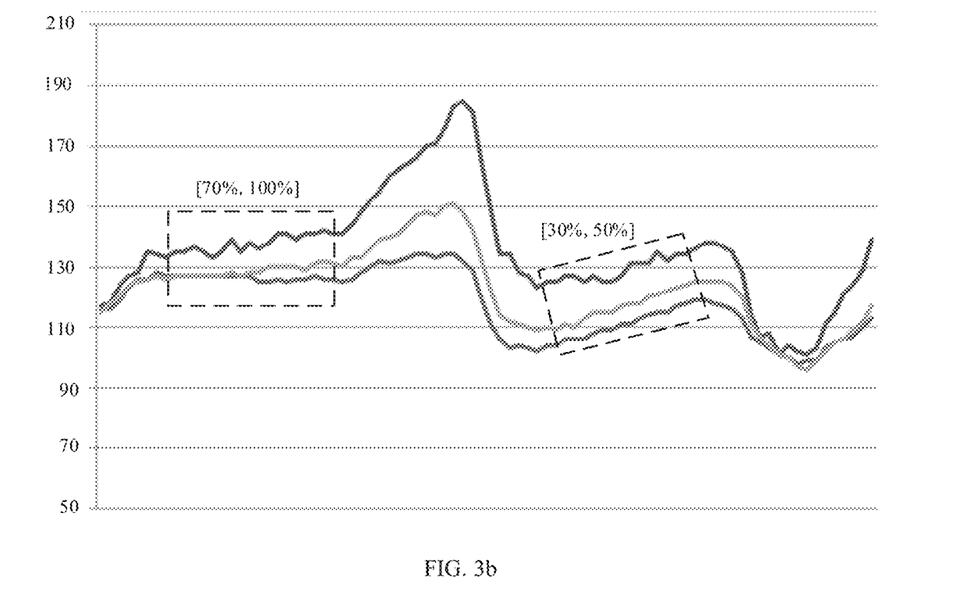
FIG. 3b is schematic diagram of a change trend of a battery's impedance under different current conditions according to an embodiment of the disclosure.
Figure 3C:
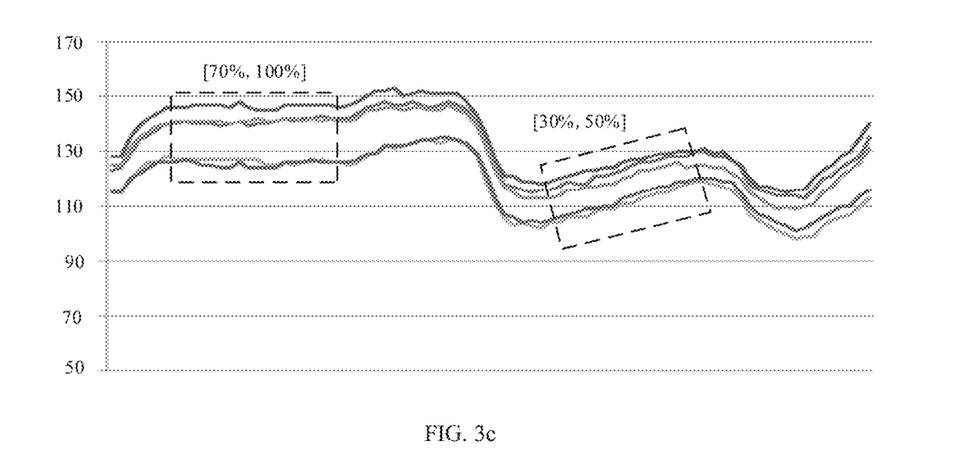
FIG. 3c is schematic diagram of a change trend of a battery's impedance when cells in a battery are different according to an embodiment of the disclosure.

For example, when the battery is currently discharged, as illustrated in FIG. 3a, the overall change trend of the battery's impedance under different temperature conditions is different, but the local change trend of the battery's impedance is relatively consistent within a state of charge range [70%, 100%], or [30%, 50%]; as illustrated in FIG. 3b, the overall change trend of the battery's impedance under different current conditions is different, but the local change trend of the battery's impedance is relatively consistent within a state of charge range [70%, 100%], or [30%, 50%]; as illustrated in FIG. 3c, when the cells in the battery are different, the overall change trend of the battery's impedance is different, but the local change trend of the battery's impedance is relatively consistent within a state of charge range [70%, 100%], or [30%, 50%]. Therefore, when the battery is in the discharging state, the real state of charge range may be the first range, and the local change trend of the battery's impedance is relatively consistent within the first range. The first range may be [70%, 100%] or [30%, 50%].

Further, when the battery is in the stationary state, the current in the battery cannot fluctuate. When the state of charge range is [0, 100%], the change trend of the battery's impedance is relatively consistent. Therefore, the second range may be [0, 100%].

At block S203, it is determined whether the current state of charge is within the real state of charge range.

At block S204, when the current state of charge is within the real state of charge range, the real state of charge is updated to the current state of charge.

In detail, when it is determined that the current state of the battery is the discharging state, if the current state of charge of the battery is within the first range, the real state of charge is updated to be the current state of charge. For example, if the current state of charge of the battery is 40%, which is within the first range [30%, 50%], the real state of charge of the battery is updated to 40%. If the current state of charge of the battery is within the second range, the real state of charge is updated to be the current state of charge. For example, if the current state of charge of the battery is 80%, which is within the first range [0, 100%], the real state of charge of the battery is updated to 80%.

At block S205, the first difference in state of charge is updated based on the integral state of charge and the real state of charge.

According to an embodiment of the disclosure, updating the first difference in state of charge based on the integral state of charge and the real state of charge includes: obtaining a current difference in state of charge based on the integral state of charge and the real state of charge; and when the current difference in state of charge is greater than or equal to a first threshold and a timing exceeds a preset duration, updating the first difference in state of charge to the current difference in state of charge.

In detail, after determining the real state of charge range based on the current state of the battery and updating the real state of charge based on the real state of charge range, the integral state of charge of the battery may be obtained, and a difference between the integral state of charge and the real state of charge of the battery to obtain a current difference in state of charge, and it is determined whether to update the first difference in state of charge based on the size of the current difference in state of charge.

If the current difference in state of charge is greater than or equal to a difference threshold (for example, 10 mAh), and a duration exceeds a preset period of time (for example, 300 s), the first difference in state of charge may be updated. At this time, the first difference in state of charge may be updated to the current difference in state of charge.

It should be noted that before updating the first difference in state of charge, it is determined whether to update the difference in state of charge based on a stable state of an average current of the battery within 50 s, or an update state of the real state of charge of the battery. If the stable state of the average current of the battery changes from a stable state to an unstable state within 50 s (that is, I-50 s stable state-unstable state), and the duration exceeds a preset period of time (for example, 300 s), or the update state of the real state of charge of the battery is from the update state to a non-update state (i.e., real state of charge: update-non-update), the first difference in state of charge may be updated.

Further, after the first difference in state of charge is calculated, the short-circuit current of the battery may be calculated based on the first difference in state of charge.

In detail, there is a certain relationship between the first difference in state of charge of the battery and the short-circuit current of the battery. That is, the certain relationship between the first difference in state of charge of the battery and the short-circuit current of the battery is denoted by a formula of:

$$I = \frac{\Delta SOC1}{\Delta t},$$

where, I represents the short-circuit current of the battery, $\Delta t$ represents a discharging period of time, and $\Delta SOC1$ represents the first difference in state of charge of the battery. Therefore, in actual applications, the short-circuit current of the battery may be obtained based on the change of the real state of charge of the battery (that is, the first difference in state of charge of the battery). The accuracy of calculating the short-circuit current of the battery depends on the accuracy of the obtained change of the real state of charge of the battery.

It should be noted that, in practical applications, a plurality of first differences may be obtained sequentially, an average difference of the plurality of the first differences is calculated, and the short-circuit current of the battery is calculated based on the average difference and a corresponding discharging duration of the battery.

Figure 4:
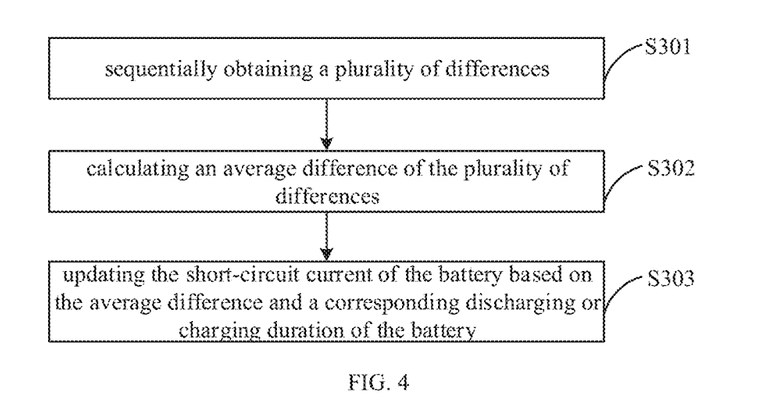
FIG. 4 is a flowchart of a method for calculating a short-circuit current of a battery according to an embodiment of the disclosure.

Based on the above embodiments, in order to more accurately calculate the short-circuit current of the battery, an embodiment of the disclosure also proposes a method for calculating the short-circuit current of the battery. As illustrated in FIG. 4, the method may include the following.

At block S301, a plurality of differences may be obtained sequentially.

In detail, after the difference in state of charge is updated, the updated difference in state of charge, the corresponding integral state of charge, and the corresponding real state of charge may be stored as a set of data into a difference register. A plurality of sets of data in the difference register may meet a first-in first-out principle. That is, the plurality of sets of data stored in the difference register may be sequentially obtained from the difference register, and the difference in state of charge for each set of data is calculated in order to obtain the plurality differences in state of charge.

Figure 5:
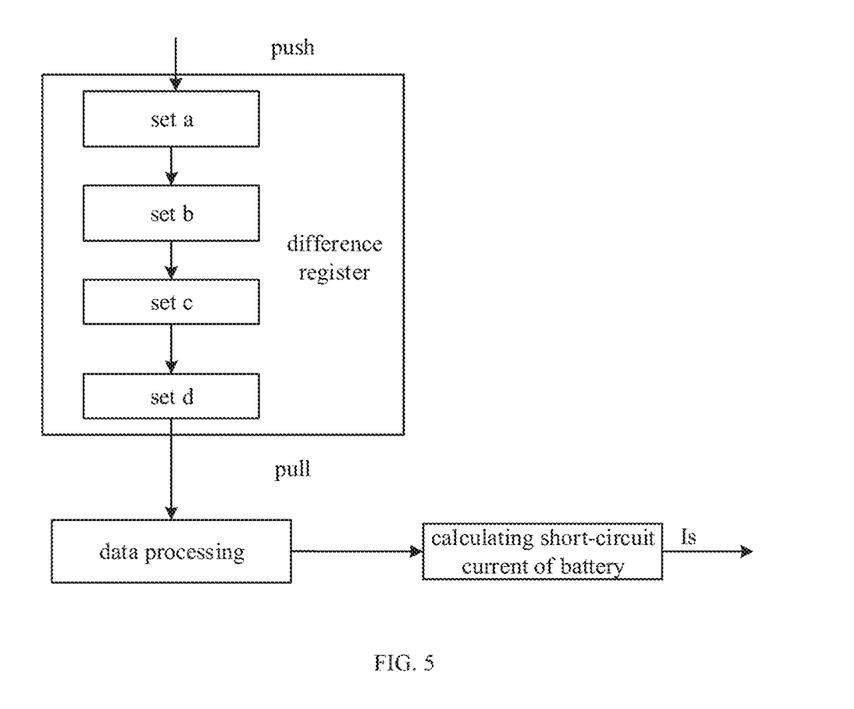
FIG. 5 is a schematic diagram of a method for calculating a short-circuit current of a battery according to an embodiment of the disclosure.

For example, as illustrated in FIG. 5, the plurality of sets of data stored in the difference register according to the chronological order are set a of data, set b of data, set c of data and set d of data. Based on the first-in first-out principle, the four sets of data may be stored into the difference register, i.e., set a of data, set b of data, set c of data and set d of data. The difference in state of charge corresponding to each set of data may be calculated, i.e., the differences in state of charge, $\Delta SOC1$, $\Delta SOC2$, $\Delta SOC3$ and $\Delta SOC4$.

At block S302, an average difference of the plurality of differences is calculated.

In detail, after sequentially obtaining the plurality of differences from the difference register, the smallest difference and the largest difference among the plurality of differences may be removed, and the remaining differences may be averaged, to obtain the average difference $\overline{\Delta SOC}$ of the plurality of differences.

For example, suppose that the four differences obtained from the difference register are $\Delta SOC1$, $\Delta SOC2$ $\Delta SOC3$, and $\Delta SOC4$. The largest difference is $\Delta SOC1$, and the smallest difference is $\Delta SOC4$ After the difference $\Delta SOC1$ and the difference $\Delta SOC4$ are removed, the average difference $\overline{\Delta SOC}$, of the four differences may be obtained, i.e., $$\overline{\Delta SOC} = \frac{\Delta SOC2 + \Delta SOC3}{2}.$$

At block S303, the short-circuit current of the battery is calculated based on the average difference and a corresponding discharging duration of the battery.

As described above, there is the certain relationship between the difference in state of charge of the battery and the short-circuit current of the battery. Therefore, after the average difference $\overline{\Delta SOC}$ of the plurality of differences is calculated, the short-circuit current Is of the corresponding battery may be calculated based on the average difference $\overline{\Delta SOC}$ and the corresponding discharging duration $\Delta t$ of the battery, i.e., $$Is = \frac{\overline{\Delta SOC}}{\Delta t}.$$

Based on the above embodiment, in order to ensure the accuracy of the calculated short-circuit current of the battery, after the short-circuit current of the battery is calculated through the above operation at block S2, the calculated short-circuit current of the battery needs to be verified. After the operation at block S2, the following operations need to be performed to ensure that the calculated short-circuit current of the battery is more accurate.

At block S3, a first real state of charge and a second real state of charge are obtained.

After calculating the first difference in state of charge between the integral state of charge at the current moment and the current state of charge, the integral state of charge may be assigned to the first real state of charge, and the current state of charge may be assigned to the second real state of charge. The first real state of charge, the second real state of charge, and the corresponding first difference in state of charge form a set of data and stored into the difference register. That is, during the execution of the operation at block S2, a plurality of sets of data may be sequentially stored into the difference register. For example, the difference register stores four sets of data, namely, set a of data, set b of data, set c of data and set d of data. Set a of data may include a first real state of charge real_soc1_0, a second real state of charge real_soc1_1, and a corresponding first difference in state of charge $\Delta cc\_soc1$; set b of data may include a first real state of charge real_soc2_0, a second real state of charge real_soc2_1, and a corresponding first difference in state of charge $\Delta cc\_soc2$; set c of data may include a first real state of charge real_soc3_0, a second real state of charge real_soc3_1, and a corresponding first difference in state of charge $\Delta cc\_soc3$, and set d of data may include a first real state of charge real_soc4_0, a second real state of charge real_soc4_1, and a corresponding first difference in state of charge Δcc_soc4.

Therefore, the first real state of charge, the second real state of charge, and the corresponding first difference in state of charge may be obtained directly from the register. A plurality of sets of data in the difference register may meet a first-in first-out principle. For example, the plurality sets of data stored into the difference register based on the chronological order are set a of data, set b of data, set c of data and set d of data. Based on the first-in first-out principle, the plurality sets of data stored in the difference register may be sequentially accessed from the difference register, namely set a of data, set b of data, set c of data and set d of data.

At block S4, the first real state of charge and the second real state of charge are updated based on a temperature-impedance table and the short-circuit current of the battery.

According to an embodiment of the disclosure, updating the first real state of charge based on the temperature-impedance table and the short-circuit current of the battery includes: obtaining a first initial open-circuit voltage based on a temperature-impedance table corresponding to the first real state of charge; obtaining a first impedance of the battery based on the temperature-impedance table corresponding to the first real state of charge; calculating a first real open-circuit voltage based on the first initial open-circuit voltage, the first impedance of the battery, and the short-circuit current of the battery; updating the first real state of charge based on a temperature-impedance table corresponding to the first real open-circuit voltage; and iteratively calculating the first impedance, the first real open-circuit voltage, and the first real state of charge.

According to an embodiment of the disclosure, updating the second real state of charge based on the temperature-impedance table and the short-circuit current of the battery includes: obtaining a second initial open-circuit voltage based on a temperature-impedance table corresponding to the second real state of charge; obtaining a second impedance of the battery based on the temperature-impedance table corresponding to the second real state of charge; calculating a second real open-circuit voltage based on the second initial open-circuit voltage, the second impedance of the battery, and the short-circuit current of the battery; updating the second real state of charge based on a temperature-impedance table corresponding to the second real open-circuit voltage; and iteratively calculating the second impedance, the second real open-circuit voltage, and the second real state of charge.

In detail, in practical applications, a temperature-impedance table of 25° C. may be used as an original temperature-impedance table, and stored in advance, so that it may be called when calculating the short-circuit current of the battery. That is, when calculating the short-circuit current of the battery, the pre-stored original temperature-impedance table, i.e., the temperature-impedance table of 25° C. may be called directly.

After obtaining the first real state of charge and the second real state of charge from the difference register, the first real state of charge and the second real state of charge may be calculated to update the first real state of charge and the second real state of charge, respectively.

In detail, the operation of updating the first real state of charge based on the temperature-impedance table and the short-circuit current Is of the battery, may include, an operation of searching the first initial open-circuit voltage, an operation of searching the first impedance, a first calculation operation, and an operation of updating the first real state of charge.

At the operation of searching the first initial open-circuit voltage, the first initial open-circuit voltage ocv1_0 may be searched out from the temperature-impedance table corresponding to the first real state of charge.

At the operation of searching the first impedance, the first impedance R1_0 of the battery may be searched out from the temperature-impedance table corresponding to the first real state of charge.

At the first calculation operation, the first real open-circuit voltage real_ocv1_0 may be calculated based on the first initial open-circuit voltage ocv_1_0, the first impedance R1_0 of the battery, and the short-circuit current Is of the battery by the formula of:

$$\text{real\_ocv} = \text{ocv} + Is^*R \qquad (1)$$

where, real_ocv represents the real open-circuit voltage, ocv represents the initial open-circuit voltage, Is represents the short-circuit current of the battery, and R represents the impedance of the battery. The first initial open-circuit voltage ocv_1_0, the first impedance R1_0 of the battery, and the short-circuit current Is of the battery may be substituted into formula (1) to calculate the first real open-circuit voltage real_ocv1_0, that is, real_ocv1_0=ocv1_0+Is*R1_0.

At the operation of updating the first real state of charge, a new first real state of charge may be searched out from the corresponding temperature-impedance table based on the first real open-circuit voltage real_ocv1_0, to update the first real state of charge.

Furthermore, performing the operation of updating the first real state of charge, the first impedance, the first real open-circuit voltage, and the first real state of charge may be calculated iteratively. That is, after the new first real state of charge may be searched out from the corresponding temperature-impedance table based on the first real open-circuit voltage real_ocv1_0, it is returned to the operation of searching the first initial open-circuit voltage, the operation of searching the first impedance, the first calculation operation, and the operation of updating the first real state of charge to perform the iterative calculation. After performing the iterative calculation for a preset number of times (for example, after the iteration calculating of 4 times), a final first real state of charge may be obtained, and the first real state of charge is updated to the final first real state of charge.

Similarly, the operation of updating the second real state of charge based on the temperature-impedance table and the short-circuit current Is of the battery, may include, an operation of searching the second initial open-circuit voltage, an operation of searching the second impedance, a second calculation operation, and an operation of updating the second real state of charge.

At the operation of searching the second initial open-circuit voltage, the second initial open-circuit voltage ocv1_1 may be searched out from the temperature-impedance table corresponding to the second real state of charge.

At the operation of searching the second impedance, the second impedance R1_1 of the battery may be searched out from the temperature-impedance table corresponding to the second real state of charge.

At the second calculation operation, the second real open-circuit voltage real_ocv1_1 may be calculated based on the second initial open-circuit voltage ocv1_1, the second impedance R1_1 of the battery, and the short-circuit current Is of the battery by formula (1). That is, the second initial open-circuit voltage ocv1_1, the second impedance R1_1 of the battery, and the short-circuit current Is of the battery may be substituted into formula (1) to calculate the second real open-circuit voltage real_ocv1_1, that is, real_ocv1_1=ocv1_1+Is*R1_1.

At the operation of updating the second real state of charge, a new second real state of charge may be searched out from the corresponding temperature-impedance table based on the second real open-circuit voltage real_ocv1_1, to update the second real state of charge.

Furthermore, performing the operation of updating the second real state of charge, the second impedance, the second real open-circuit voltage, and the second real state of charge may be calculated iteratively. That is, after the new second real state of charge may be searched out from the corresponding temperature-impedance table based on the second real open-circuit voltage real_ocv1_1, it is returned to the operation of searching the second initial open-circuit voltage, the operation of searching the second impedance, the second calculation operation, and the operation of updating the second real state of charge to perform the iterative calculation. After performing the iterative calculation for a preset number of times (for example, after the iteration calculating of 4 times), a final second real state of charge may be obtained, and the second real state of charge is updated to the final second real state of charge.

At block S5, a second difference in state of charge is calculated based on the updated first real state of charge and the updated second real state of charge.

After updating the first real state of charge and the second real state of charge, a difference operation may be performed between the updated first real state of charge and the updated second real state of charge, to obtain the second difference in state of charge.

At block S6, the short-circuit current of the battery is updated based on the second difference in state of charge.

In detail, there is a certain relationship between the second difference in state of charge of the battery and the short-circuit current of the battery. That is, the certain relationship between the second difference in state of charge of the battery and the short-circuit current of the battery is denoted by a formula of:

$$I = \frac{\Delta SOC2}{\Delta t},$$

where, I represents the short-circuit current of the battery, $\Delta t$ represents a discharging period of time, and $\Delta SOC2$ represents the second difference in state of charge of the battery. Therefore, in actual applications, after the second difference in state of charge is calculated, the short-circuit current of the battery may be updated based on the second difference in state of charge of the battery and the corresponding discharging period of time.

Therefore, in the embodiment of the disclosure, the first difference in state of charge may be calculated based on the integral state of charge and the current state of charge, the short-circuit current of the battery may be calculated based on the first difference in state of charge, and then the temperature-impedance table, the first real state of charge, the second real state of charge, and the calculated short-circuit current of the battery may be calculated to update the short-circuit current of the battery, thereby accurately obtaining the change of the real state of charge of the battery in real time, and further accurately calculating the short-circuit current of the battery.

It should be noted that, in practical applications, the first differences in the plurality of sets of data may be sequentially obtained from the difference register, for example, four sets of data may be obtained from the difference register. At this time, the first real state of charge and the second real state of charge in each set of data may be calculated to obtain a plurality of new first real state of charge and a plurality of new second real state of charge, so that a plurality of second differences in state of charge may be calculated. For the method of calculating the first real state of charge and the second real state of charge in each set of data to obtain the plurality of second differences, may refer to the foregoing embodiment. To avoid redundancy, details are not described herein.

Furthermore, after obtaining the second differences of the plurality of sets of data, the smallest difference and the largest difference among the second differences may be removed, and the remaining differences may be averaged, to obtain the average difference among the second differences. The short-circuit current of the battery is updated based on the average difference and the discharging duration of the corresponding battery. Therefore, the first real state of charge and the second real state of charge in each set of data may be calculated respectively to obtain a plurality of new first real state of charge and a plurality of new second real state of charge, and a plurality of new second differences may be calculated. The plurality of new second differences may be averaged to further improve the accuracy of the obtained difference in state of charge.

Figure 6:
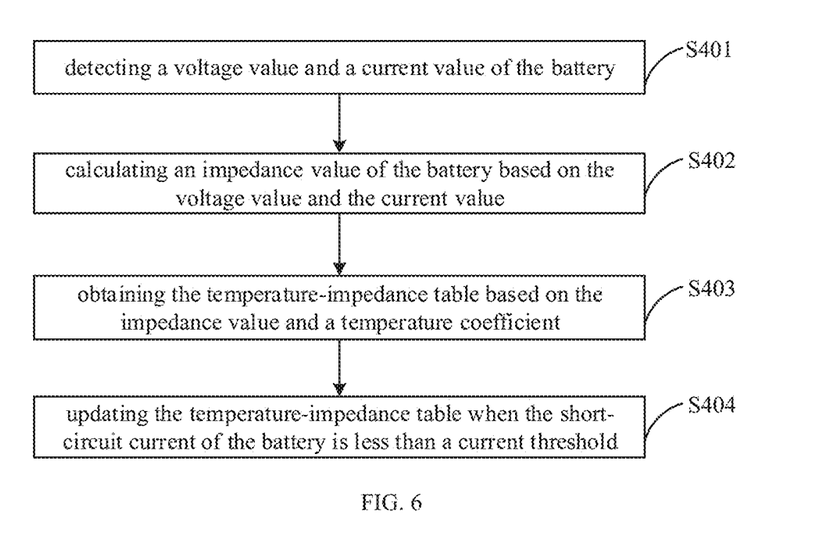
FIG. 6 is a schematic diagram of a method for updating the temperature-impedance table according to an embodiment of the disclosure.

It should be understood that the usage of the battery is a continuous aging process, and the battery's impedance is constantly changing during the aging process of the battery (in general, the battery's impedance is gradually increasing). Therefore, when calculating the short-circuit current of the battery in the above way, the temperature-impedance table needs to be updated. Therefore, in an embodiment of the disclosure, a method for updating the temperature-impedance table is also proposed. As illustrated in FIG. 6, this method may include the following.

At block S401, a voltage value and a current value of the battery are detected.

In detail, the voltage values and the current values of the battery in different states may be detected. When the battery is in a stationary state (for example, when the mobile phone is on the screen, the battery in the mobile phone is in a stationary state), the pulse current of the battery may be detected to obtain the voltage change amount $\Delta U$ and the current change amount $\Delta I$ of the battery; when the battery is in a discharging state (for example, when the mobile phone is running and the battery in the mobile phone is in a discharging state), if the discharging duration of the battery is greater than or equal to a set duration (for example, 500 s), the voltage U and current I of the battery are detected respectively.

At block S402, an impedance value of the battery is calculated based on the voltage value and the current value.

When the battery is currently in the stationary state, the polarization resistance value R of the battery may be calculated based on the voltage change amount $\Delta U$ and the current change amount $\Delta I$ of the battery, that is, $R=\Delta U/\Delta I$; when the battery is currently in the discharging state, the resistance value DCR of the battery may be calculated based on the voltage U and the current I, that is, DCR=U/I.

At block S403, the temperature-impedance table is obtained based on the impedance value and a temperature coefficient and stored.

After the impedance value of the battery in the current state is calculated, a new temperature-impedance table may be obtained based on the impedance value and the temperature coefficient, and is stored into a temperature-impedance table register (for example, a temperature-impedance table register of 25° C.), so that it may be called when the temperature-impedance table needs to be updated.

At block S404, when the short-circuit current of the battery is less than a current threshold, the temperature-impedance table is updated.

In detail, after the current short-circuit current of the battery is calculated in the manner in the foregoing embodiment, if the current short-circuit current of the battery is less than the current threshold (for example, 10 mA), it is called the new temperature-impedance table stored temporarily in the temperature-impedance table register, and the new temperature-impedance table is updated to a to-be-updated flash area of the temperature-impedance table, so as to update the temperature-impedance table.

It should be noted that the update of the temperature-impedance table and the calculation of the short-circuit current of the battery are independent of each other and can be calculated simultaneously.

Therefore, in the process of calculating the short-circuit current of the battery, the temperature-impedance table may be updated in real time. By taking fully into account that during the usage of the battery, the change in its impedance will affect the calculation of the short-circuit current of the battery, the accuracy of calculating the short-circuit current of the battery may be greatly improved.

In summary, with the method for calculating the short-circuit current of the battery according to an embodiment of the disclosure, the integral state of charge and the current state of charge of the battery may be obtained, the first difference in state of charge between the integral state of charge and the current state of charge may be calculated, and the short-circuit current of the battery may be calculated based on the first difference in state of charge; the first real state of charge and the second real state of charge may be obtained, the first real state of charge and the second real state of charge may be updated based on the temperature-impedance table and the short-circuit current of the battery; the second difference in state of charge may be calculated based on the updated first real state of charge and the updated second real state of charge, and the short-circuit current of the battery may be updated based on the second difference in state of charge. Therefore, it may accurately obtain changes in the battery's real state of charge in real time, thereby accurately calculating the short-circuit current of the battery.

In addition, an embodiment of the disclosure also proposes a computer-readable storage medium having stored therein computer programs. When the computer programs are executed by a processor, the method described above is performed.

With the computer-readable storage medium according to an embodiment of the disclosure, by executing the method described above, it may accurately obtain changes in the battery's real state of charge in real time, thereby accurately calculating the short-circuit current of the battery.

Figure 7:
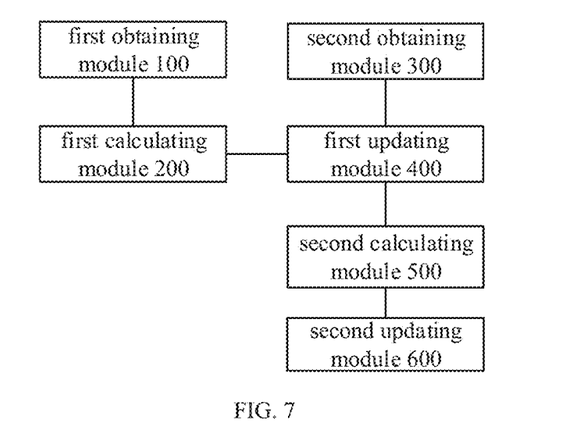
FIG. 7 is a block diagram of an apparatus for calculating a short-circuit current of a battery according to an embodiment of the present disclosure.

FIG. 7 is a block diagram of an apparatus for calculating a short-circuit current of a battery according to an embodiment of the present disclosure. As illustrated in FIG. 7, the apparatus may include a first obtaining module 100, a first calculating module 200, a second obtaining module 300, a first updating module 400, a second calculating module 500 and a second updating module 600.

The first obtaining module 100 is configured to obtain an integral state of charge and a current state of charge of the battery. The first calculating module 200 is configured to calculate a first difference in state of charge between the integral state of charge and the current state of charge, and calculate the short-circuit current of the battery based on the first difference in state of charge. The second obtaining module 300 is configured to obtain a first real state of charge and a second real state of charge. The first updating module 400 is configured to update the first real state of charge and the second real state of charge based on a temperature-impedance table and the short-circuit current of the battery. The second calculating module 500 is configured to calculate a second difference in state of charge based on the updated first real state of charge and the updated second real state of charge. The second updating module 600 is configured to update the short-circuit current of the battery based on the second difference in state of charge.

It should be noted that, for details not disclosed in the apparatus for calculating the short-circuit current of the battery in the embodiments of the disclosure, details disclosed in the method for calculating the short-circuit current of the battery in the embodiments of the disclosure may refer to, and details are not described herein again.

With the apparatus for calculating the short-circuit current of the battery according to an embodiment of the disclosure, the integral state of charge and the current state of charge of the battery may be obtained, the first difference in state of charge between the integral state of charge and the current state of charge may be calculated, and the short-circuit current of the battery may be calculated based on the first difference in state of charge; the first real state of charge and the second real state of charge may be obtained, the first real state of charge and the second real state of charge may be updated based on the temperature-impedance table and the short-circuit current of the battery; the second difference in state of charge may be calculated based on the updated first real state of charge and the updated second real state of charge, and the short-circuit current of the battery may be updated based on the second difference in state of charge. Therefore, it may accurately obtain changes in the battery's real state of charge in real time, thereby accurately calculating the short-circuit current of the battery.

Figure 8:
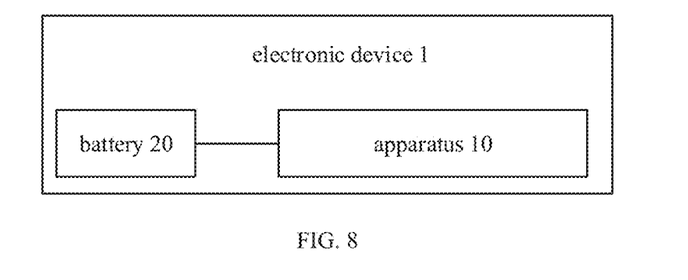
FIG. 8 is a block diagram of an electronic device according to an embodiment of the disclosure.

FIG. 8 is a block diagram of an electronic device according to an embodiment of the disclosure. As illustrated in FIG. 8, the electronic device 1 according to the embodiment of the disclosure may include the above-mentioned apparatus 10 for calculating the battery short-circuit current and a battery 20.

With the electronic device according to the embodiment of the disclosure, it may accurately obtain changes in the battery's real state of charge in real time, thereby accurately calculating the short-circuit current of the battery.

Any process or method described in a flow chart or described herein in other ways may be understood to include one or more modules, segments or portions of codes of executable instructions for achieving specific logical functions or steps in the process, and the scope of a preferred embodiment of the present disclosure includes other implementations, which should be understood by those skilled in the art.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

In addition, in the description of the present disclosure, it is to be understood that, terms such as "center", "longitudinal", "lateral", "length", "width", "thickness", "over", "below", "front", "back", "left", "right", "vertical", "horizontal", "top", "bottom", "in", "out", "clockwise", "anticlockwise", "axial", "radial" and "circumference" refer to the directions and location relations which are the directions and location relations shown in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, terms such as "first" and "second" are used herein for purposes of description and are not intended to indicate or imply relative importance or significance. Furthermore, the feature defined with "first" and "second" may comprise one or more this feature distinctly or implicitly. In the description of the present disclosure, "a plurality of" means two or more than two, unless specified otherwise.

In the present disclosure, unless specified or limited otherwise, the terms "mounted," "connected," "coupled" and "fixed" are understood broadly, such as fixed, detachable mountings, connections and couplings or integrated, and can be mechanical or electrical mountings, connections and couplings, and also can be direct and via media indirect mountings, connections, and couplings, and further can be inner mountings, connections and couplings of two components or interaction relations between two components, which can be understood by those skilled in the art according to the detail embodiment of the present disclosure.

In the present disclosure, unless specified or limited otherwise, the first characteristic is "on" or "under" the second characteristic refers to the first characteristic and the second characteristic can be direct or via media indirect mountings, connections, and couplings. And, the first characteristic is "on", "above", "over" the second characteristic may refer to the first characteristic is right over the second characteristic or is diagonal above the second characteristic, or just refer to the horizontal height of the first characteristic is higher than the horizontal height of the second characteristic. The first characteristic is "below" or "under" the second characteristic may refer to the first characteristic is right over the second characteristic or is diagonal under the second characteristic, or just refer to the horizontal height of the first characteristic is lower than the horizontal height of the second characteristic.

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. A method for calculating an internal short-circuit current of a battery, comprising:
    obtaining an integral state of charge and a current state of charge of the battery;
    calculating a first difference in state of charge between the integral state of charge and the current state of charge;
    calculating the internal short-circuit current of the battery based on the first difference in state of charge and a discharging period of time of the battery;
    obtaining a first real state of charge as the integral state of charge and a second real state of charge as the current state of charge of the battery;
    updating the first real state of charge and the second real state of charge based on a temperature-impedance table and the internal short-circuit current of the battery;
    calculating a second difference in state of charge based on the updated first real state of charge and the updated second real state of charge;
    updating the internal short-circuit current of the battery based on the second difference in state of charge and the discharging period of time of the battery;
    detecting a voltage value and a current value of the battery;
    calculating an impedance value of the battery based on the voltage value and the current value;

obtaining the temperature-impedance table based on the impedance value and a temperature coefficient; and updating the temperature-impedance table when the short-circuit current of the battery is less than a current threshold, wherein updating the internal short-circuit current of the battery includes storing the updated internal short-circuit current in a register of a device used to calculate the internal short-circuit current of the battery.

2. The method of claim 1, wherein updating the first real state of charge based on the temperature-impedance table and the short-circuit current of the battery comprises:

obtaining a first initial open-circuit voltage based on a temperature-impedance table corresponding to the first real state of charge;

obtaining a first impedance of the battery based on the temperature-impedance table corresponding to the first real state of charge;

calculating a first real open-circuit voltage based on the first initial open-circuit voltage, the first impedance of the battery, and the short-circuit current of the battery;

updating the first real state of charge based on a temperature-impedance table corresponding to the first real open-circuit voltage; and iteratively calculating the first impedance, the first real open-circuit voltage, and the first real state of charge.

3. The method of claim 1, wherein updating the second real state of charge based on the temperature-impedance table and the short-circuit current of the battery comprises:

obtaining a second initial open-circuit voltage based on a temperature-impedance table corresponding to the second real state of charge;

obtaining a second impedance of the battery based on the temperature-impedance table corresponding to the second real state of charge;

calculating a second real open-circuit voltage based on the second initial open-circuit voltage, the second impedance of the battery, and the short-circuit current of the battery;

updating the second real state of charge based on a temperature-impedance table corresponding to the second real open-circuit voltage; and iteratively calculating the second impedance, the second real open-circuit voltage, and the second real state of charge.

4. The method of claim 1, wherein obtaining the integral state of charge of the battery comprises:

detecting a current of the battery; and integrating the current of the battery to obtain the integral state of charge of the battery.

5. The method of claim 1, further comprising:

obtaining a current state of the battery;

determining a real state of charge range based on the current state of the battery;

determining whether the current state of charge is within the real state of charge range;

updating a real state of charge to the current state of charge when the current state of charge is within the real state of charge range; and updating the first difference in state of charge based on the integral state of charge and the real state of charge.

6. The method of claim 5, wherein determining the real state of charge range based on the current state of the battery comprises:

when the battery is currently in a discharging or charging state, determining the real state of charge range to be a first range, the first range being a range in which an impedance change trend of the battery is consistent during discharging or charging; and when the battery is currently in a stationary state, determining the real state of charge range to be a second range, the second range being a range in which an impedance change trend of the battery is consistent when the battery is stationary.

7. The method of claim 6, wherein the first range is [70%, 100%] or [30%, 50%], and the second range is [0,100%].

8. The method of claim 5, wherein updating the first difference in state of charge based on the integral state of charge and the real state of charge comprises:

obtaining a current difference in state of charge based on the integral state of charge and the real state of charge; and when the current difference in state of charge is greater than or equal to a first threshold and a timing exceeds a preset duration, updating the first difference in state of charge to the current difference in state of charge.

9. The method of claim 1, wherein calculating the short-circuit current of the battery based on the first difference comprises:

sequentially obtaining a plurality of first differences;

calculating an average difference of the plurality of first differences; and calculating the short-circuit current of the battery based on the average difference and a corresponding discharging or charging duration of the battery.

10. The method of claim 1, wherein updating the short-circuit current of the battery based on the second difference comprises:

sequentially obtaining a plurality of second differences;

calculating an average difference of the plurality of second differences; and updating the short-circuit current of the battery based on the average difference and a corresponding discharging or charging duration of the battery.

11. A non-transitory computer-readable storage medium having stored therein computer programs that, when executed by a processor, a method for calculating an internal short-circuit current of a battery is performed, the method comprising:

obtaining an integral state of charge and a current state of charge of the battery;

calculating a first difference in state of charge between the integral state of charge and the current state of charge;

calculating the internal short-circuit current of the battery based on the first difference in state of charge and a discharging period of time of the battery;

obtaining a first real state of charge as the integral state of charge and a second real state of charge as the current state of charge of the battery;

updating the first real state of charge and the second real state of charge based on a temperature-impedance table and the internal short-circuit current of the battery;

calculating a second difference in state of charge based on the updated first real state of charge and the updated second real state of charge;

updating the internal short-circuit current of the battery based on the second difference in state of charge and the discharging period of time of the battery;

detecting a voltage value and a current value of the battery;

calculating an impedance value of the battery based on the voltage value and the current value;

obtaining the temperature-impedance table based on the impedance value and a temperature coefficient; and updating the temperature-impedance table when the short-circuit current of the battery is less than a current threshold, wherein updating the internal short-circuit current of the battery includes storing the updated internal short-circuit current in a register of a device used to calculate the internal short-circuit current of the battery.

12. An electronic device comprising:
a battery;
a processor; and
a memory for storing instructions executable by the processor;
wherein the processor is configured to:
    obtain an integral state of charge and a current state of charge of the battery;
    calculate a first difference in state of charge between the integral state of charge and the current state of charge;
    calculate an internal short-circuit current of the battery based on the first difference in state of charge and a discharging period of time of the battery;
    obtain a first real state of charge as the integral state of charge and a second real state of charge as the current state of charge of the battery;
    update the first real state of charge and the second real state of charge based on a temperature-impedance table and the internal short-circuit current of the battery;
    calculate a second difference in state of charge based on the updated first real state of charge and the updated second real state of charge;
    update the internal short-circuit current of the battery based on the second difference in state of charge and the discharging period of time of the battery;
    detect a voltage value and a current value of the battery;
    calculate an impedance value of the battery based on the voltage value and the current value;
    obtain the temperature-impedance table based on the impedance value and a temperature coefficient; and
    update the temperature-impedance table when the short-circuit current of the battery is less than a current threshold, wherein updating the internal short-circuit current of the battery includes storing the updated internal short-circuit current in a register of a device used to calculate the internal short-circuit current of the battery.

13. The electronic device of claim 12, wherein the processor is configured to update the first real state of charge based on the temperature-impedance table and the short-circuit current of the battery by operations of:
    obtaining a first initial open-circuit voltage based on a temperature-impedance table corresponding to the first real state of charge;
    obtaining a first impedance of the battery based on the temperature-impedance table corresponding to the first real state of charge;
    calculating a first real open-circuit voltage based on the first initial open-circuit voltage, the first impedance of the battery, and the short-circuit current of the battery;
    updating the first real state of charge based on a temperature-impedance table corresponding to the first real open-circuit voltage; and
    iteratively calculating the first impedance, the first real open-circuit voltage, and the first real state of charge.

14. The electronic device of claim 12, wherein the processor is configured to update the second real state of charge based on the temperature-impedance table and the short-circuit current of the battery by operations of:
    obtaining a second initial open-circuit voltage based on a temperature-impedance table corresponding to the second real state of charge;
    obtaining a second impedance of the battery based on the temperature-impedance table corresponding to the second real state of charge;
    calculating a second real open-circuit voltage based on the second initial open-circuit voltage, the second impedance of the battery, and the short-circuit current of the battery;
    updating the second real state of charge based on a temperature-impedance table corresponding to the second real open-circuit voltage; and
    iteratively calculating the second impedance, the second real open-circuit voltage, and the second real state of charge.

15. The electronic device of claim 12, wherein the processor is further configured to:
    obtain a current state of the battery;
    determine a real state of charge range based on the current state of the battery;
    determine whether the current state of charge is within the real state of charge range;
    update a real state of charge to the current state of charge when the current state of charge is within the real state of charge range; and
    update the first difference in state of charge based on the integral state of charge and the real state of charge.

16. The electronic device of claim 15, wherein the processor is further configured to determine a real state of charge range based on the current state of the battery by operations of:
    when the battery is currently in a discharging or charging state, determining the real state of charge range to be a first range, the first range being a range in which an impedance change trend of the battery is consistent during discharging or charging; and
    when the battery is currently in a stationary state, determining the real state of charge range to be a second range, the second range being a range in which an impedance change trend of the battery is consistent when the battery is stationary.

17. The electronic device of claim 16, wherein the first range is [70%, 100%] or [30%, 50%], and the second range is [0,100%].

18. The electronic device of claim 15, wherein the processor is configured to update the first difference in state of charge based on the integral state of charge and the real state of charge by operations of:
    obtaining a current difference in state of charge based on the integral state of charge and the real state of charge; and
    when the current difference in state of charge is greater than or equal to a first threshold and a timing exceeds a preset duration, updating the first difference in state of charge to the current difference in state of charge.

* * * * *

UNITED STATES PATENT AND TRADEMARK OFFICE
CERTIFICATE OF CORRECTION

Page 1 of 1

PATENT NO. : 11,525,862 B2
APPLICATION NO. : 16/843627
DATED : December 13, 2022
INVENTOR(S) : Hong Xie et al.

It is certified that error appears in the above-identified patent and that said Letters Patent is hereby corrected as shown below:

On the Title Page

Item (73) please delete "Assignee: NINGDE AMPEREX TECHNOLOGY LIMITED, Fujian (CN)" and insert -- Assignee: DONGGUAN NVT TECHNOLOGY CO., LTD., Dongguan (CN) --

Signed and Sealed this
Twenty-second Day of July, 2025

Coke Morgan Stewart
*Acting Director of the United States Patent and Trademark Office*